(12) United States Patent
Park

(10) Patent No.: US 6,824,652 B2
(45) Date of Patent: Nov. 30, 2004

(54) SPUTTERING TARGET ASSEMBLY AND SPUTTERING APPARATUS USING THE SAME

(75) Inventor: Jae Yeol Park, Daegu-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/330,435

(22) Filed: Dec. 30, 2002

(65) Prior Publication Data

US 2003/0165639 A1 Sep. 4, 2003

(30) Foreign Application Priority Data

Mar. 2, 2002 (KR) .......................................... 2002-11193

(51) Int. Cl.⁷ ............................................. C23C 14/35
(52) U.S. Cl. ............................ 204/192.12; 204/298.12; 204/298.17; 349/187
(58) Field of Search ........................ 204/192.12, 298.12, 204/298.17; 349/187

(56) References Cited

U.S. PATENT DOCUMENTS 4,606,802 A * 8/1986 Kobayashi et al. ..... 204/192.15
6,433,842 B1 * 8/2002 Kaneko et al. ............... 349/43

FOREIGN PATENT DOCUMENTS

DE             239807 A1 * 10/1986    ........... C23C/14/36

* cited by examiner

*Primary Examiner*—Steven Versteeg
(74) *Attorney, Agent, or Firm*—McKenna Long & Aldrige LLP

(57) ABSTRACT

A sputtering target assembly includes a backing plate of which both surfaces are evenly formed and a target having one surface that is evenly formed and attached to one surface of the backing plate and the other surface that is formed with different thicknesses according to a location thereof.

15 Claims, 4 Drawing Sheets

SPUTTERING TARGET ASSEMBLY AND SPUTTERING APPARATUS USING THE SAME

This application claims the benefit of Korean Patent Application No. P2002-11193 filed on Mar. 02, 2002, which is hereby incorporated by reference for all purposes as if fully set forth herein.

BACKGROUND OF THE INVENTION

1. Field of the Invention

The present invention relates to a sputtering apparatus, and more particularly, to a sputtering target assembly and a sputtering apparatus using the same. The present invention is especially applicable in enhancing target utilization in a magnetron sputtering apparatus.

2. Description of the Related Art

Recently, image display units have changed from a cathode ray tube (CRT) display to a flat panel display such as liquid crystal display devices and plasma display panels. When compared to a cathode ray tube, a liquid crystal display device has lower power consumption, can be manufactured to be lighter and thinner, and does not radiate any harmful electromagnetic waves. Thus, the liquid crystal display device is well suited for the next-generation high-technology image display apparatus.

FIG. 1 is a schematic view showing a structure of a typical liquid crystal display device. Referring to FIG. 1, a typical liquid crystal display device includes a thin film transistor (hereinafter referred to as TFT) substrate, a color filter substrate, a liquid crystal layer, and a backlight unit. A TFT array is formed on the TFT substrate, and color filters are formed on the color filter substrate. The liquid crystal layer is formed between the TFT substrate and the color filter substrate. The backlight unit provides light to display an image.

Here, the TFT array formed on the TFT substrate transmits and controls an electrical signal, and the liquid crystal layer controls the degree or amount of transmittance according to an applied voltage. The light controlled through these procedures passes through the color filter substrate so that desired colors and images are displayed.

When a black matrix layer is formed on the color filter substrate or an electrode is formed on the TFT substrate, a metal such as chrome (Cr) is deposited using a sputtering apparatus. Here, in a thin film forming method using a sputtering process, a target formed of a desired thin film material is disposed within a vacuum chamber, and a substrate is disposed at a position corresponding to the target. Then, argon (Ar) ions are injected. Collision particles, such as argon (Ar) particles, ionized due to plasma formed within the vacuum chamber collide with a surface of a negatively charged target. Particles come off of the target or are sputtered due to the collision energy and are deposited on the substrate.

The thin film forming method using the sputtering process includes, for example, a diode sputtering method, a bias sputtering method, a high frequency sputtering method, a triode sputtering method and a magnetron sputtering method. In case of the widely used magnetron sputtering method, a magnet is mounted on the back surface of the target. Therefore, in the sputtering process, since a higher density of plasma is formed at a target region where the magnet exists than other regions, more target atoms are emitted, thereby enhancing the deposition rate of the thin film.

However, unlike these advantages, as the sputtering process is performed, a target erosion rate is high for a specific portion, which degrades the whole utilization of the target.

Presently, it is possible to implement various magnetron sputtering apparatuses. FIG. 2 is a conceptional view showing an erosion state of the target according to the location of the magnet in a typical magnetron sputtering apparatus. As shown in FIG. 2, an erosion topology of the target 21 is different according to a location of the magnet 23.

Referring to FIG. 2, when the sputtering process is performed using the magnet in the typical magnetron sputtering apparatus, a partial erosion of the target 21 occurs due to a uniform division of a magnetic field. Thus, the sputtering deposition is performed using only a portion of the target 21, resulting in an ineffective utilization of the target.

To improve these disadvantages, a magnetron sputtering apparatus has been provided using a moving magnet, in which the fixed magnet 23 becomes a moving magnet. In such magnetron sputtering apparatus using a moving magnet, however, the target 21 still does not erode uniformly in all the regions. Moreover, the erosion occurs partially in a non-uniform manner.

Thus, to effectively use the target, the target is divided and is formed with different thicknesses according to the location of the target, taking into account the non-uniform erosion tendency of the target.

FIG. 3 is a schematic view showing a topology of a conventional sputtering target assembly employed in the typical magnetron sputtering apparatus. As shown in FIG. 3, targets 35 and 37 of a sputtering assembly 30 are divided with different thickness according to the location thereof. The targets 35, which are formed to be relatively thick, are in regions where over-erosion occurs, and the target 37, which is formed to be relatively thin, is in a region where less erosion occurs. Thus, a step topology is formed. By leveling the surfaces of the targets 35 and 37 and applying the step topology to an appropriate region of the backing plates 31 and 33, a region of the backing plate 31 (in which only the back plate 31 is formed) corresponding to the over-erosion region 35 of the targets is protected and the utilization of the targets 35 and 37 can be enhanced and maximized.

Here, the erosion topology of the targets 35 and 37 is theoretically calculated for the magnetron sputtering apparatus and its operating condition. The degree of step of the backing plates 31 and 33 is determined according to the thickness of each location of the calculated targets 35 and 37.

During the sputtering process in actual production using the magnetron sputtering apparatus employing the backing plates 31 and 33 (which are designed with the step thereon) an operating condition may be changed according to different production models. Such change in the operating condition also changes the theoretically calculated erosion topology of the targets. Here, a problem occurs in that the backing plates 31 and 33 should also be modified/redesigned so as to correspond to the newly changed operating condition.

Since the backing plates 31 and 33 are modified/redesigned according to the changed operating condition, the backing plates 31 and 33 tend to be articles of consumption in the production, which increases cost.

SUMMARY OF THE INVENTION

Accordingly, the present invention is directed to sputtering target assembly and sputtering apparatus that substantially obviates one or more of the problems due to limitations and disadvantages of the related art.

Accordingly, an advantage of the present invention is to enhance the utilization of the sputtering targets.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a sputtering target assembly is provided including a backing plate having two evenly formed surfaces and a target having one portion evenly formed and on one surface of the backing plate and another portion having a different thickness from the one portion. The target can be made having a divided structure according to its thickness. Thus, different sections or portions of the target have different thicknesses. The target also has a region where there is a tendency for over-erosion, thus being formed relatively thicker.

According to another aspect of the present invention, a sputtering apparatus is provided including a sputtering target assembly having a backing plate having two evenly formed surfaces and a target having one evenly formed surface and on one surface of the backing plate and another surface having a different thickness at a different location, and a magnet below a bottom surface of the backing plate, the magnet generating a magnetic field at the targets. The magnet can be a moving magnet that moves below the bottom surface of the backing plate. The target can be made having a divided structure according to its thickness. Thus, different sections or portions of the target have different thickness. The target also has a region where there is a tendency for over-erosion, thus being formed relatively thicker.

Thus, when an erosion topology of the targets is changed due to a change in the sputtering apparatus or operating condition, target utilization can be enhanced by changing only the topology of the targets without modifying/redesigning the backing plate.

In another aspect of the present invention, a sputtering target assembly comprises a backing plate having first, second and third regions; a first target corresponding to the first region of the backing plate; a second target corresponding to the second region of the backing plate; and a third target corresponding to the third region of the backing plate, It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to an embodiment of the present invention, example of which is illustrated in the accompanying drawings.

Figure 1:
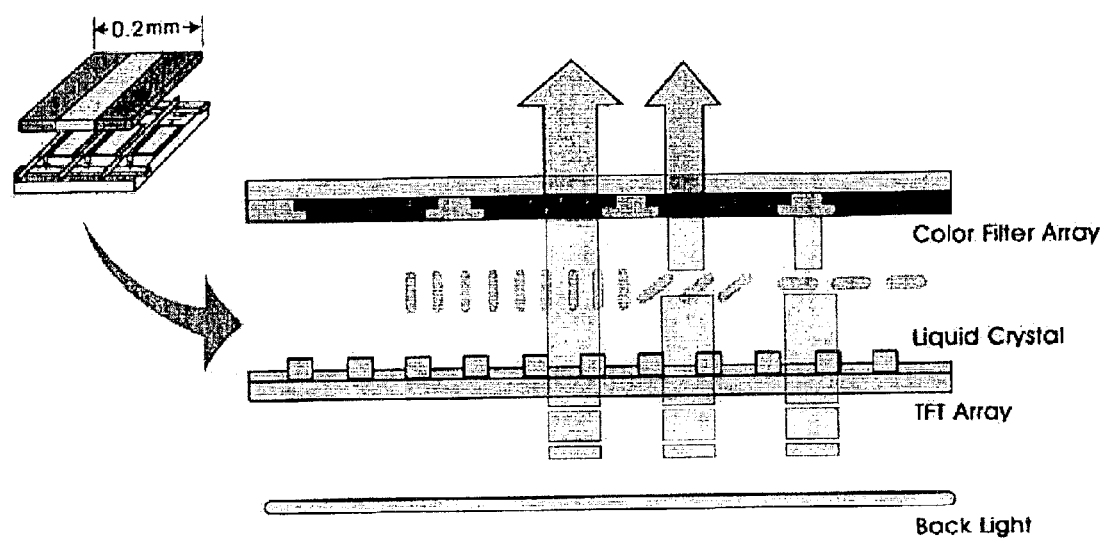
FIG. 1 is a schematic view showing a structure of a conventional liquid crystal display unit.
Figure 2:
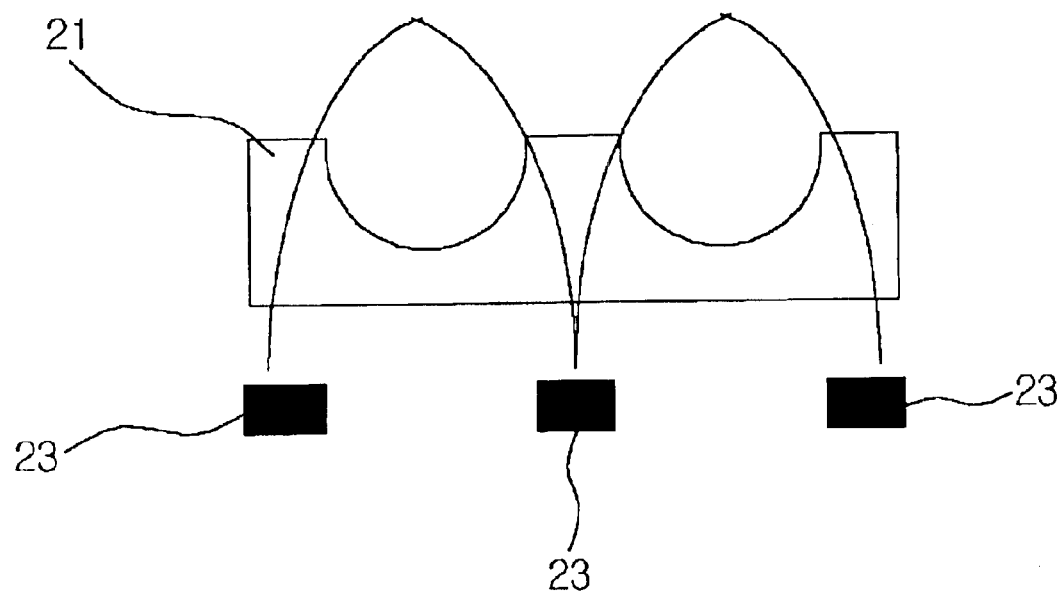
FIG. 2 is a conceptional view showing an erosion status of a target according to a position of a magnetron in a conventional magnetron sputtering apparatus.
Figure 3:
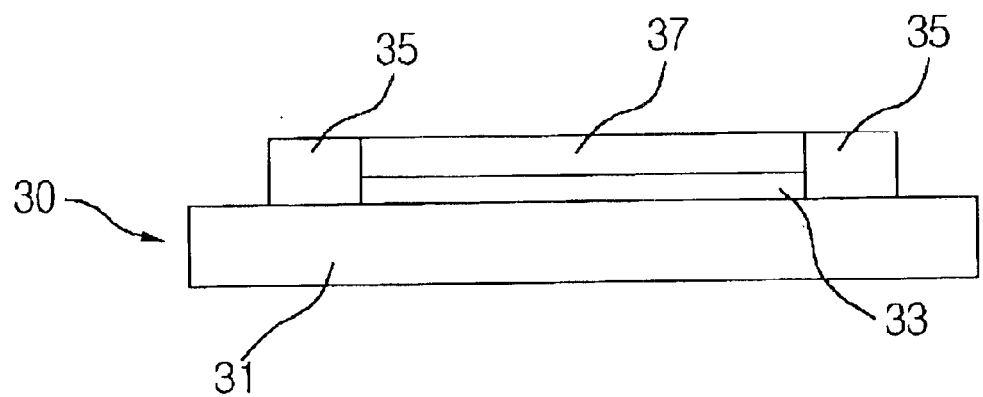
FIG. 3 is a schematic view showing a topology of a conventional sputtering target assembly employed in a conventional magnetron sputtering apparatus.
Figure 4:
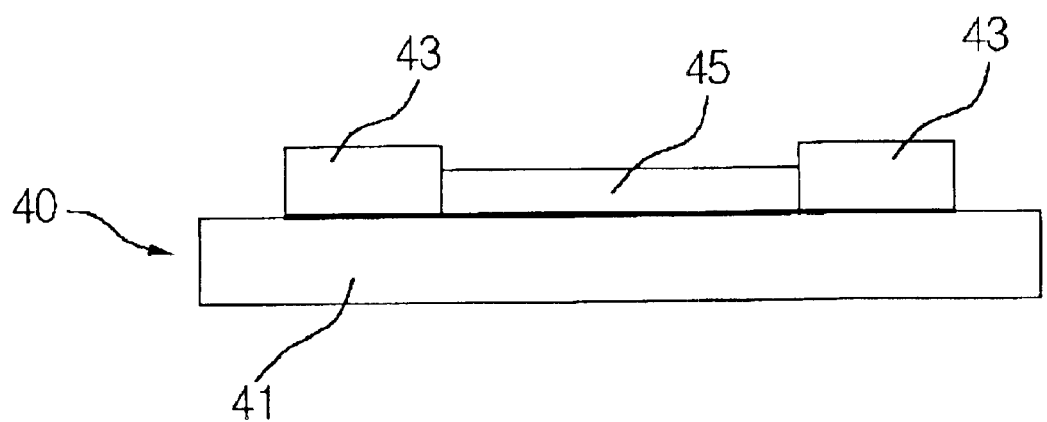
FIG. 4 is a schematic view showing a topology of a sputtering target assembly employed in a magnetron sputtering apparatus in accordance with the present invention.

FIG. 4 is a schematic diagram showing a topology of a sputtering target assembly employed in a magnetron sputtering apparatus in accordance with the present invention.

Referring to FIG. 4, the sputtering target assembly 40 in accordance with the present invention includes a backing plate 41 and targets 43 and 45. Both surfaces of the backing plate 41 are evenly formed. One surface of each target 43 and 45 is evenly formed and is attached to or on one surface of the backing plate 41, and the other surface of each target 43 and 45 is formed with different thicknesses according to a location of the targets 43 and 45.

Thus, as shown in FIG. 4, both surfaces of the backing plate 41 are evenly formed. The backing plate 41 may be formed evenly in thickness without any step. Also, target 43 where an over-erosion occurs is formed to be relatively thick, and the other target 45 is formed to be relatively thin. At this time, when the targets 43 and 45 are attached to the backing plate 41, since the backing plate 41 has a uniform surface, a step is formed on the top surface of the targets 43 and 45.

Here, the step formed on the targets 43 and 45 allows the topology of the targets 43 and 45 to be easily implemented in accordance with erosion topology, which is theoretically calculated according to an operating condition. This is done by separately forming the targets 43 and 45 according to each thickness requirement of the targets 43 and 45.

Figure 5:
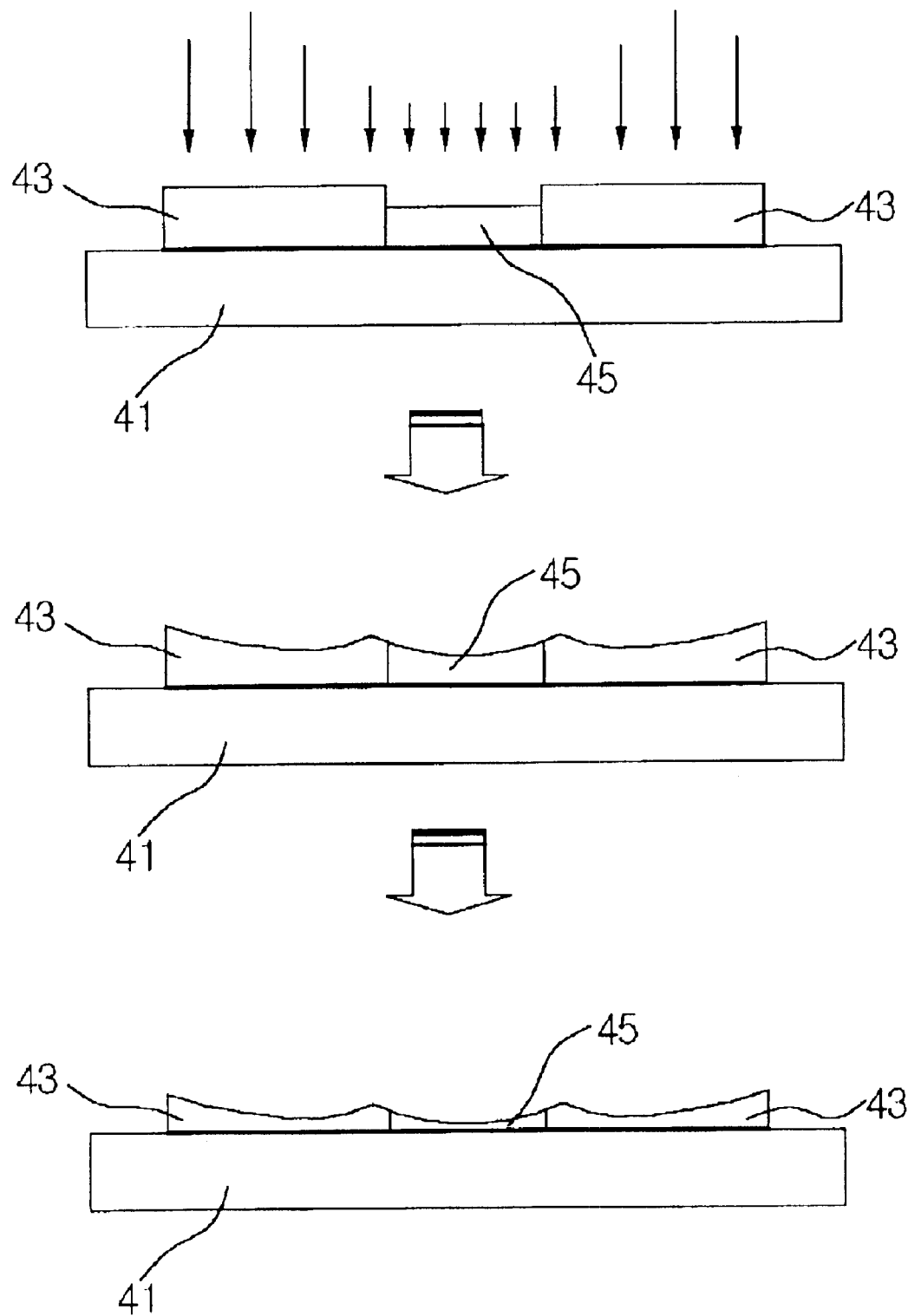
FIG. 5 illustrates an erosion state as the target is used with time in a magnetron sputtering apparatus employing a sputtering target assembly in accordance with the present invention.

When sputtering operation is performed using the sputtering assembly having the above-described topology, target erosion can be described with reference to FIG. 5. FIG. 5 illustrates an erosion state as the target is used with time in a magnetron sputtering apparatus employing a sputtering target assembly in accordance with the present invention.

Referring to FIG. 5, first, at an initial state of a sputtering operation, particles such as argon (Ar) ions are injected in an upward direction toward the targets 43 and 45, which have the step formed thereon. In this way, erosion of the targets 43 and 45 occurs sequentially and, finally, the erosion occurs relatively uniformly regardless of the thickness difference between the targets 43 and 45. Thus, the targets 43 and 45 are effectively utilized.

Further, when the erosion topology of the targets 43 and 45 is changed due to a change in the sputtering apparatus or the operating condition, the thickness of the targets 43 and 45 can be easily changed according to the changed erosion topology. Accordingly, even when the sputtering apparatus or the operating condition is changed, the present invention is advantageous in that there is no need to modify the backing plate 41.

Furthermore, instead of forming the step to the backing plate 41, and forming the step to the targets 43 and 45 which are the articles of consumption, the step can be changed more flexibly, thereby optimizing the utilization of the targets 43 and 45. Since an arcing can occur in the step when the step between the targets 43 and 45 is formed, there is a need to calculate an optimum value of the step width.

In accordance with the present invention, a sputtering apparatus employing the above-described sputtering assembly includes a sputtering target assembly 40 and a magnet (not shown). The sputtering target assembly includes a backing plate 41 and targets 43 and 45.

Both surfaces of the backing plate 41 are evenly formed. One surface of each target 43 and 45 is evenly formed and is attached to one surface of the backing plate 41, and the other surface thereof is formed with different thicknesses depending on the location of the targets 43 and 45. The magnet is disposed below a bottom surface of the backing plate 41 and generates a predetermined magnetic field to the targets.

Here, the utilization of the targets 43 and 45 can be enhanced by moving the magnet. When the moving magnet is employed, since a film forming rate according to the targets 43 and 45 can be different, the moving rate of the moving magnet should be suitably controlled.

As described above, in the sputtering target assembly and the sputtering apparatus in accordance with the present invention, when the erosion topology of the targets is changed due to a change in the sputtering apparatus or the operating condition, effective utilization of the target can be enhanced by changing only the topology of the targets without modifying/redesigning of the backing plate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a liquid crystal display device comprising:

forming a thin film transistor array substrate including a thin film layer, the thin film layer being made using a sputtering target assembly including a backing plate having a first and second surfaces, and entirety of the first surface being level; and a target having one level surface attached to the first surface of the backing plate and another surface having a stepped portion, the target having different thickness portions corresponding to the stepped portion, wherein the target has a first region where an over-erosion occurs and a second region, the first region being thicker than the second region.

2. The method of claim 1, further comprising:

forming a color filter substrate; and forming a liquid crystal layer between the thin film transistor array substrate and the color filter substrate.

3. The method of claim 1, wherein the target has a divided structure according to thickness.

4. A sputtering target assembly comprising:

a backing plate having first and second surfaces, an entirety of the first surface being level; and a target having one level surface and attached to the first surface of the backing plate and another surface having stepped portion, the target having different thickness portions corresponding to the stepped portion, wherein the target has a first region where an over-erosion occurs and a second region, the first region being thicker than the second region.

5. The sputtering target assembly of claim 4, wherein the target has a divided structure according to thickness.

6. A sputtering apparatus comprising:

a sputtering target assembly including a backing plate having first and second surfaces, an entirety of the first surface being level; and a target having one level surface attached to the first surface of the backing plate and another surface having a stepped portion, the target having different thickness portions corresponding to the stepped portion, wherein the target has a first region where an over-erosion occurs and a second region, the first region being thicker than the second region; and a magnet below a bottom surface of the backing plate, the magnet generating a magnetic field to the target.

7. The sputtering apparatus of claim 6, wherein the magnet is a moving magnet capable of moving below the bottom surface of the backing plate.

8. The sputtering target assembly of claim 6, wherein the target has a divided structure according to thickness.

9. A sputtering target assembly comprising:

a backing plate having first, second and third regions;

a first target corresponding to the first region of the backing plate;

a second target corresponding to the second region of the backing plate; and a third target corresponding to the third region of the backing plate, wherein the first target and the second target have different thickness and wherein the first target and the second target are uniformly consumed.

10. The sputtering target assembly of claim 9, wherein the first target and the third target have substantially the same thickness.

11. The sputtering target assembly of claim 10, wherein the first target and the third target are thicker than the second target.

12. The sputtering target assembly of claim 10, wherein the first target, the second target and the third target having thicknesses which allow for uniform consumption.

13. The sputtering target assembly of claim 9, wherein the first target is thicker than the second target.

14. A sputtering target assembly comprising:

a backing plate having first, second and third regions;

a first target corresponding to the first region of the backing plate;

a second target corresponding to the second region of the backing plate; and a third target corresponding to the third region of the backing plate, wherein the first target and the second target have different thickness, wherein the first target and the third target have substantially the same thickness, and wherein the first target and the third target are thicker than the second target.

15. A sputtering target assembly comprising:

a backing plate having first, second and third regions;

a first target corresponding to the first region of the backing plate;

a second target corresponding to the second region of the backing plate; and a third target corresponding to the third region of the backing plate, wherein the first target and the second target have different thickness and wherein the first target and the third target are thicker than the second target.

* * * * *